Figure 1:
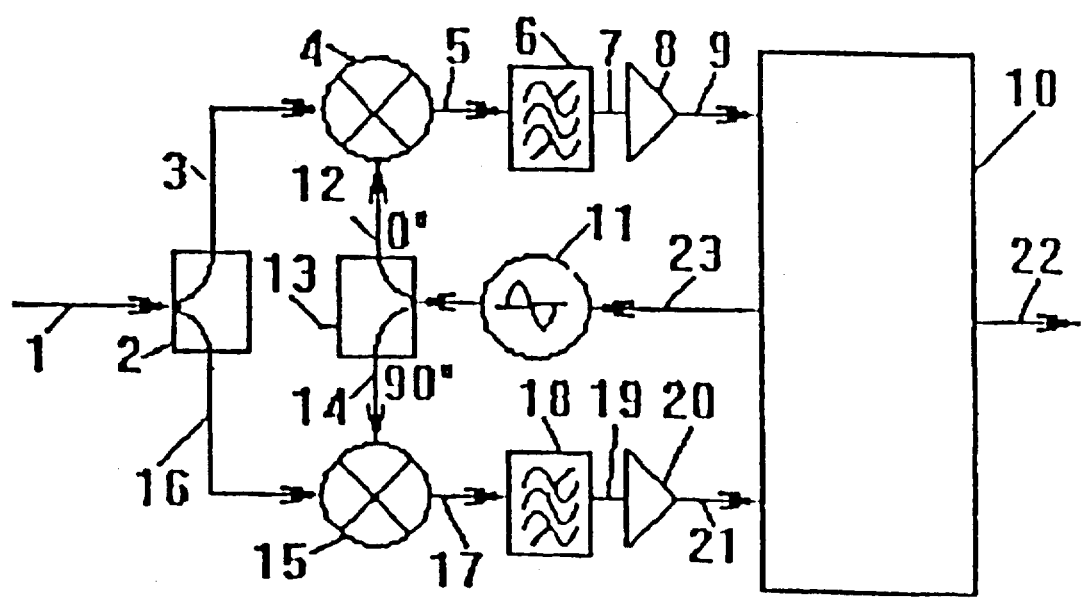

United States Patent [19]

Behrent

[11] Patent Number: 5,896,061

[45] Date of Patent: *Apr. 20, 1999

[54] HOMODYNE RECEIVER AND PROCESS FOR CORRECTING THE CONVERTED RECEIVED SIGNAL

[75] Inventor: Hermann Behrent, Kuddewörde, United Kingdom

[73] Assignee: Sican Gesellschaft Fur Silizium-Anwendungen Und Cad/Cat, Hanover, Germany

[*] Notice: This patent is subject to a terminal disclaimer.

[21] Appl. No.: 08/256,105

[22] PCT Filed: Oct. 29, 1993

[86] PCT No.: PCT/DE93/01034

§ 371 Date: Sep. 22, 1994

§ 102(e) Date: Sep. 22, 1994

[87] PCT Pub. No.: WO94/10756

PCT Pub. Date: May 11, 1994

[30] Foreign Application Priority Data

Oct. 29, 1992 [DE] Germany ............... 42 36 547

[51] Int. Cl.$^6$ ............... H03D 3/00; H04L 27/227
[52] U.S. Cl. ............... 329/308; 329/306; 375/325; 375/327; 375/329
[58] Field of Search ............... 329/304–310; 375/324–325, 329–333, 327

[56] References Cited

U.S. PATENT DOCUMENTS

| | | | |
|---|---|---|---|
| 4,484,143 | 11/1984 | French et al. | 329/305 |
| 5,280,538 | 1/1994 | Kataoka et al. | 329/306 X |
| 5,438,591 | 8/1995 | Oie et al. | 329/306 X |

*Primary Examiner*—David Mis
*Attorney, Agent, or Firm*—Stein, Schifino & Van Der Wall

[57] ABSTRACT

The invention pertains to a homodyne receiver, in particular for angle-modulated carrier signals in which the converted signal (ZF) has a d.c. voltage portion, and a process for correcting the converted receiving signal. Essentially three classes of errors occur with homodyne receivers: d.c. offset, amplitude difference and phase errors between the in-phase (I) and quadrature (Q) branches. Standard adjustments of the local oscillator with phase-locked loop (PLL) do not work in the case of weak signals. To use cost-effective, rapid analog/digital converters, particularly the d.c. offset has to be separated out. In so far as this has been done previously and the I and Q signal were corrected also, these corrections could be accomplished only with expensive components in the RF class. To avoid this the invention provides an arithmetic unit that is designed for converting into a circle the ellipse set by the distorted I and Q signals. The ellipse parameters are determined in particular by means of an equalizing computation using at least five samples of the I and Q signals. From the ellipse parameters the errors causing the elliptical form are then calculated and compensated.

8 Claims, 1 Drawing Sheet

HOMODYNE RECEIVER AND PROCESS FOR CORRECTING THE CONVERTED RECEIVED SIGNAL

The invention relates to a homodyne receiver (Direct Conversion Receiver), especially for angle-modulated carrier signals, specifically including those in which the converted signal (IF) exhibits a DC voltage component (DC component), and to a process for correcting the converted input signal.

Direct conversion receivers are known for example from DE 29 02 952 C2. According to this, it is theoretically sufficient to mix the received signal, if required after a preamplification, with the carrier frequency generated by a local oscillator and to separate off any high sum frequencies which arise in this case using a lowpass filter. The filtered signal is to correspond to the demodulated signal. The frequency of the local oscillator in a phase locked loop (PLL) is intended to be set to the carrier frequency. The PLL for frequency and phase locking is necessary because, when using customary reference signal sources, there is in principle a relatively large or small frequency deviation in relation to the carrier frequency. The synchronization of the local oscillator with the carrier frequency or respectively the frequency of the emitting oscillator must therefore first be forced. To this end, the received carrier is utilized as reference signal for the locking. The error signal employed for controlling the local oscillator cannot, if the received signal is very weak and is disturbed on the transmission path, be distinguished from the DC offset arising in the case of the direct conversion of the modulated carrier signal. The PLL locking then fails.

According to GB 2 192 506 the angle-modulated input signal is split into two branches and the frequency of a local oscillator is mixed with the two branches; in this case, a phase shift of the frequency mixed in of 90° is set for one branch. The mixed signal in the branch without phase shift is named the in-phase signal (I), and the mixed signal in the branch with phase shift is named the quadrature signal (Q). Lowpass filters and analog/digital converters are provided. The digital signals from both branches are passed to a digital signal processor (DSP). In the latter, the demodulated signal is calculated from the I and Q signals. The I and Q signals also exhibit a DC offset originating from the direct conversion of the modulated carrier signal. Further undesired DC offsets may arise on account of the crosstalk of the local oscillator onto the signal inputs of the mixer and on account of the relative phase relation of the local oscillator to the carrier of the received signal. Any amplifiers which may possibly be inserted likewise lead to a further DC offset. The total sum of the DC offset voltages (resulting from operating temperature, the aging of the components, phase angle, crosstalk, amplifier offset) may be, in the case of very small input signals, several tens of thousands of times larger than the useful signal, so that an AD converter must have a large dynamic range in order to be able still to resolve the useful signal. Thus, taking in account the required resolution of the useful signal, the use of economic and fast AD converters is substantially ruled out.

For heterodyne receivers, the use of a bandpass filter for the IF signal was proposed for example in WO88/10033. By this means, a DC offset is separated off. However, along with the DC offset, DC components of the converted signal are also separated off by the bandpass filters. In the case of many types of modulation, the (short-term) DC component of the converted signal contains information on the modulating signal. Along with the separating of the DC component of the converted signal, accordingly information on the modulating signal is also lost, consequently a considerable disturbance of the demodulated signal takes place. In particular, the nonlinear distortion factor is increased.

Further more substantial components which lead to disturbing distortions of the orthogonal quadrature signals in the baseband in the case of the homodyne receiver are, besides the DC offset, the amplitude difference and the phase error between the I and Q branches. The amplitude difference arises upon the splitting of the input signal and the unequal amplification in the signal branches. The phase error arises on account of the deviation of the two LO signals at the two mixers from the nominally required 90° and the differing phase overlays in the two signal branches.

A process for correcting amplitude and phase errors in the I and Q signals has already been described in DE 39 38 671 A1. In that document, the I and Q signals were converted into new signals which exhibit a lower amplitude and phase error. However, a frequency doubling takes place, which requires higher sampling frequencies during the further processing. This involves an increased expenditure. Moreover, with a limitation applicable on the permissible nonlinear distortion factor and while avoiding additional frequencies, only very small errors of the I and Q signals can be permitted, which can be achieved only with costly components in the RF assembly. Accordingly, the process does not lead to an extensive error correction.

EP 0 343 273 A1 relates to a correction circuit for a digital quadrature signal pair. Offset errors, amplitude errors and phase errors are corrected. In this case, it is assumed that the distortion-free signal without the mentioned errors represents a circle in the central position. The distortions lead to the displacement of the circle away from the origin (offset), to the flattening of the circle to form an ellipse (amplitude error) and to the shifting or rotation of the ellipse; in this case, a polar coordinate representation of in-phase and quadrature signal was assumed. Control variables for correcting offset, amplitude error and phase error are derived from the extreme values of the ellipse. Apart from the known susceptibilities of such control systems, such as the occurrence of instabilities or even resonances, the proposed control system can be implemented only in those cases where the signal is substantially undisturbed. Only then do the in-phase and quadrature signals describe in the polar coordinate representation an ellipse which is sufficiently precise for the control system. In the case of signals which are present in practice, however, in addition to the mentioned error variables and distortions respectively, disturbances such as signal noise are also superposed. The in-phase and quadrature signals then describe in the polar coordinate representation a cloud of points of, seen in broad terms, elliptical shape. In this case, the proposed control system does not appear to function sufficiently. Moreover, the locus curve must be run through sufficiently frequently, so that the individual values are set to be uniformly distributed on the ellipse to be assumed. This applies especially where, as intended, an averaging of the extreme values is to take place. In addition, a preferred circuit for an extreme value determination is proposed, in which the decay time is very much greater than the rise time. Thus, values situated at the margin of the cloud of points are more strongly included in the determination of the extreme values than values which are situated further in. The control system thus reacts to a considerable extent not to the distortions alone, but to the disturbance variables superposed on the distortions, so that, especially in the case of small signal amplitudes, no suitable control variables could be derived for the compensation of the distortions.

The object of the invention was to specify a homodyne receiver and a process for correcting the converted input signal, with which an extensive correction of the substantial errors DC offset, amplitude error and phase error can take place to a very substantial extent.

The object is achieved by the receiver-according to claim 1 and the process according to claim 5.

In the case of an error-free conversion of an angle-modulated signal, the orthogonal baseband signals (I, Q) are the orthogonal components of a vector of constant magnitude which is rotated by the modulating signal around the origin. In this case, the tip of this vector travels on a circle around the origin.

Surprisingly, it was found that the mentioned errors can lead to a distortion of the circle to form an ellipse. The amplitude error effects a compression of the circle in one axial direction of the system of coordinates; the phase error leads to a rotation of the axes relative to one another and the DC offsets lead to the displacement of the ellipse on the origin of coordinates.

The homodyne receiver according to the invention exhibits for the received signal a signal divider with which the signal is guided into two signal branches. A local oscillator with a direct and a phase-shifted output (90°) is provided. The outputs of the local oscillator lead to mixers, disposed in the signal branches, for generating the I and Q signal respectively. In the two signal branches, lowpass filters are provided for the suppression of undesired mixing products, carrier residues. Expediently, signal amplifiers are additionally disposed in the two signal branches. The two signal branches are fed to a computer system, preferably a digital signal processor (DSP). Suitable analog/digital converters are expediently disposed between the signal amplifiers and the DSP. The AD conversion can however also take place in the computer system itself.

In a preferred computer system, the quasi-orthogonal signals I and Q are sampled synchronously, AD-converted and then utilized as a value pair for a subsequent analysis. The value pairs correspond to points on an ellipse which is defined by measurement errors due to the conversion and due to disturbances from the transmission channel.

The sampled I and Q values situated on the ellipse or respectively in the environment thereof are converted, in the computer system, into corresponding values situated in the environment of a circle around the origin of coordinates.

By means of a compensation calculation, e.g. using a linear regression—I. O. KERNER "Bester kegelschnitt durch n Punkte" [Best conical section through n points], ZAMM 59, 396–397 (1979), or using an orthogonal regression—G. GEISE and I. STAMMLER "Koordinatensystem-invariante Ausgleichskegelschnitte" [Coordinate-system-invariant compensation conical sections], Contributions to Algebra and Geometry 21 (1986), 125–144, the characteristic five parameters for the description of the best fitting ellipse or of the best fitting elliptical spiral through five or more measured and selected points are determined in the computer system.

Using the thus determined parameters, the values of the errors (deviations) are computed. Removal of distortion is executed by means of an inverse transformation of the measured value pairs from the environment of the ellipse into that of the original circle. On this basis, the distortions caused by the instrumentation of the conversion are then very largely eliminated and the signal is made ready for demodulation.

The demodulated signal is then cleared of the distortions due to the deviation of the LO.

Preferably, the local oscillator employed exhibits a frequency deviation from the carrier frequency of the received signal. In the case of hitherto conventional receivers, attempts were made to avoid this as far as possible. In some cases, costly control loops were even employed in order to tune the frequency of the local oscillator as precisely as possible to the carrier frequency. Compared with this, the invention provides an opposite teaching. The frequency of the local oscillator is to differ from the carrier frequency to such an extent that the actual DC components of the converted signal are raised into the transmission range of the bandpass filters. Expressed in different terms, the frequency deviation is to be selected so that it lies within the transmission range of the bandpass filters. Accordingly, what matters is not a random deviation of the frequency of the local oscillator from the carrier frequency, but that the frequency deviation of the local oscillator from the carrier frequency is tuned to the lower transmission range of the bandpass filters.

As a result of the frequency deviation of the local oscillator, the spectrum of the converted signal present downstream of the mixers is displaced by the frequency deviation. As a result of the dimensioning rule, according to the invention, for the frequency deviation, the actual DC component of the converted signal is not separated off with the DC offset. As a result of the selection, according to the invention, of the frequency of the local oscillator in conjunction with the thus executed AC coupling, advantageously the dynamic range for the AD converter is restricted, without losing information about the modulating signal.

As a result of the frequency deviation, set according to the invention, of the local oscillator, a distortion of the demodulated signal is intentionally set. This also leads in a direction opposite to the conventional mode of procedure. The distortion generated by the frequency deviation can, in comparison with the remaining distortions, which are separated off by the bandpass filter, be compensated relatively easily in the computer system. As a result of the combination, according to the invention, of an AC coupling on the one hand and the intentional setting of a frequency deviation of the local oscillator on the other hand, distortions which are difficult to separate off are replaced by a compensatable distortion. It is now possible to use economic AD converters having a dynamic range which is adapted to the dynamic range of the useful signal.

In principle, the frequency deviation (difference between frequency of the local oscillator and the carrier frequency) must lie within the transmission range of the bandpass filter. The frequency deviation must therefore lie between the lower limit frequency and the upper limit frequency of the bandpass filter. Since with the frequency deviation not only the DC component of the baseband signal is raised, but this applies to all frequencies of the baseband signal, the frequency deviation must be selected so that even the greatest (displaced) frequency of the baseband signal which is to be expected lies within the transmission range of the bandpass filter. It is furthermore necessary to observe the blocking range between a plurality of transmission channels. Assuming an ideal bandpass filter, the maximum frequency deviation can assume half of the value of the difference between the channel center spacing and the channel width employed. In the case of a real bandpass filter, the frequency deviation must be smaller, as a function of the flank steepness. The flank steepness at the lower limit frequency of the bandpass filter also determines the minimum required frequency deviation of the local oscillator.

The homodyne receiver according to the invention exhibits a computer system which is designed for the compensation of the distortion generated by the constant frequency deviation of the local oscillator from the carrier frequency.

The distortion generated according to the invention due to the frequency deviation is recognizable as an additional steady phase change of the modulated signal. It effects a continuous rotation of the baseband vector. The compensation for the additional continuous phase change generated by the constant frequency deviation can take place, for example, by means of piece-by-piece formation of the mean value of the demodulated signal. In the case of modulation with digital information, the distortion, generated by the constant frequency deviation, of the demodulated signal can be determined as the gradient of a compensating straight line in the phase-time graph and can be compensated for.

For the compensation of the errors caused by the frequency deviation of the LO, a property of the signal, which property is to be assumed as known in the receiver, can however also be sought and evaluated. A property to be assumed as known is in the case of analog speech signals its freedom from DC, in the case of digital signals either the type of modulation using relatively steady dwell or reversal locations of the signal vector or the so-called training sequences, for example in the case of GSM and DECT, or modulation-free CW portions. The removal of distortion from the baseband signals takes place in the invention to such a great extent that it is possible to dispense with any feedback of derived control signals for the checking of the LO.

An illustrative embodiment of the process according to the invention is explained with reference to the diagrammatic representation in FIG. 1. FIG. 1 shows, in diagrammatic representation, a block diagram of a homodyne receiver with a downstream computer system.

Via the line 1, the received signal is fed to a signal divider 2. In the signal divider 2, the received signal is split into a first component and a second component. The first component is fed via the line 3 to a mixer 4. In the mixer 4, the first signal part is mixed with the signal present at the direct output 12 of the local oscillator 11. As a result of this, the in-phase signal (I) is formed at the mixer 4. This signal is fed via the line 5 to the bandpass filter 6. There, undesired mixing products, carrier frequency residues, but also DC offsets are separated off. The filtered signal is fed via the line 7 to a signal amplifier 8. The amplified signal is fed via the line 9, possibly after interposition of an AD converter, to the computer system 10. The second signal path generated in the signal divider 2 is fed via the line 16 to the mixer 15. In the mixer 15, the signal of the local oscillator 11, which signal is present at the output 13 of the local oscillator 11 and is fed via the line 14 and is phase-shifted by 90°, is mixed with the second signal part fed via the line 16. The mixing product, which is designated as the quadrature signal (Q), is fed via the line 17 to the bandpass filter 18. The function of the bandpass filter 18 corresponds to that of the above-described bandpass filter 6. The filtered Q signal is fed via the line 19 to a signal amplifier 20. From here, possibly after an analog-digital conversion (not shown), it is passed via the line 21 into the computer system 10. There, the conversion of the I and Q values situated in the environment of the ellipse to the values situated in the environment of a circle disposed at the origin of coordinates takes place.

To this end, in the first instance, the parameters of the ellipse are determined in a compensating calculation. After this, the errors causing the ellipse are computed from the ellipse expressed in parametric form. Subsequently, the determined errors are compensated in the distorted I and Q signals.

The demodulation by means of the I and Q signals is also executed in the computer system 10. In this case, the demodulated signal per se is formed, but this is still distorted on account of the frequency deviation, provided according to the invention, of the local oscillator. In the phase-time graph, the distortion is recognizable, for example where the modulating signal is speech, as a steady superposed rise in the phase-time graph. This steady rise is determined in the computer system by portionwise mean value formation and can then be compensated (subtracted). The demodulated, distortion-free signal is passed via the line 22 to further assemblies.

In a particular design, it can be provided that the local oscillator 11 is regulatable in order to permit "spread spectrum" applications. For this purpose, a control line 23 can lead from the computer system 10 to the local oscillator 11. In this case also, the frequency deviation provided according to the invention is preserved.

What is claimed is:

1. Homodyne receiver having a signal divider, a local oscillator with a direct and a phase-shifted output, having two mixers for generating I and Q signal, two bandpass filters for suppressing undesired mixing products and carrier residues and DC offsets, two signal amplifiers and a computer system for removal of distortion, which computer system is designed for the conversion of the ellipse defined by the distorted I and Q signals into a circle, characterized in that the computer system is designed for the determination of the ellipse parameters by means of a compensating calculation via at least 5 sampled values of the I signal and 5 sampled values of the Q signal.

2. Homodyne receiver according to claim 1, characterized in that the computer system is designed for the determination of the errors causing the ellipse shape from the determined ellipse parameters.

3. Homodyne receiver according to claim 2, characterized in that the computer system is designed for the compensation of the errors causing the ellipse.

4. Homodyne receiver according to one of claims 1 to 3, characterized in that the local oscillator exhibits a defined frequency deviation in relation to the carrier frequency, so that the difference frequency between carrier frequency and oscillator frequency lies within the transmission range of the bandpass filters.

5. Process for the direct conversion and correction of the converted received signal of a homodyne receiver by splitting of the received signal into two signal branches, mixing of the first signal branch with the signal of a local oscillator, mixing of the second signal branch with that signal of a local oscillator which is shifted by 90°, bandpass filtering, amplification, AD conversion and demodulation as well as removal of distortion in a computer system, in which the conversion of the ellipse defined by the distorted I and Q signals into a circle takes place at the origin, characterized in that the parameters of a compensating ellipse are determined, in the computer system, by at least 5 sampled values of the I signal and 5 sampled values of the Q signal.

6. Process according to claim 5, characterized in that the errors causing the ellipse are determined from the ellipse parameters.

7. Process according to claim 6, characterized in that the errors are compensated in the distorted I and Q signals.

8. Process according to claim 7, characterized in that I and Q signals are demodulated, the continuous phase change is determined by piece-by-piece formation of the mean value or by determination of the gradient of a compensating straight line in the phase-time graph and is compensated for.

\* \* \* \* \*